United States Patent [19]

Demand

[11] Patent Number: 4,491,173

[45] Date of Patent: Jan. 1, 1985

[54] ROTATABLE INSPECTION TABLE

[75] Inventor: Erhart E. Demand, Boston, Mass.

[73] Assignee: Temptronic Corporation, Newton, Mass.

[21] Appl. No.: 383,337

[22] Filed: May 28, 1982

[51] Int. Cl.³ .................................................. F28F 5/00
[52] U.S. Cl. .................................... 165/11 R; 165/30; 165/48 R; 165/80 R; 165/86; 219/218; 269/21; 354/154; 354/208
[58] Field of Search ............... 165/11 R, 26, 30, 48 R, 165/61, 62, 63, 64, 80 R, 80 A, 80 B, 80 C, 80 D, 80 E, 86, 170; 354/154, 153, 208; 219/218; 269/21

[56] References Cited

U.S. PATENT DOCUMENTS

| | | | |
|---|---|---|---|
| 3,383,918 | 5/1968 | Cumbers et al. | 374/154 |
| 3,768,551 | 10/1973 | Wiley et al. | 165/170 X |
| 4,139,051 | 2/1979 | Jones et al. | 165/80 R |
| 4,253,515 | 3/1981 | Swiatosz | 165/80 A |
| 4,403,567 | 9/1983 | da Costa et al. | 165/80 E |

FOREIGN PATENT DOCUMENTS 2753684  6/1979  Fed. Rep. of Germany .

Primary Examiner—Sheldon J. Richter
Attorney, Agent, or Firm—Schiller & Pandiscio

[57] ABSTRACT

An improved device for supporting and holding an object in place under temperature controlled conditions is described. The device comprises a shaft mounted for rotation about a rotation axis, and a top plate coupled to and rotatable with the shaft. The top plate comprises a top substantially planar surface disposed normally to said axis, a bottom surface disposed opposite the top surface, and at least one aperture disposed in the top surface for providing a negative pressure vacuum so that the object can be held in place on the top surface by the negative pressure vacuum. Electrical temperature sensing means is disposed in the top plate for providing an electrical signal as a function of the temperature of the top plate. Electrical temperature modification means is coupled to and rotatable with the shaft and disposed relative to the bottom surface of the top plate for maintaining the temperature of the top plate at a preselected temperature. Heat sink means is coupled to and rotatable with the shaft and disposed relative to the temperature modification means for drawing excess heat from the temperature modification means away from the top plate. Finally, the table comprises a plurality of electrically-conductive brushes mounted in a spaced-apart relation, and a plurality of electrically-conductive rings concentrically mounted with respect to the axis. Each ring is mounted in a plane normal to the axis and is in electrical contact with and rotatably movable with respect to at least one of the brushes as the table turns about the axis, wherein at least two of the rings are electrically coupled to the electrical temperature sensing means so that the electrical signal can be transmitted from the table, and at least two of the rings are electrically coupled to the electrical temperature modification means so that electrical power can be transmitted to those means.

17 Claims, 5 Drawing Figures

ROTATABLE INSPECTION TABLE

The present invention relates generally to rotatable inspection tables, and more particularly to a rotatable table or chuck for supporting and holding objects in place while processing, testing and/or inspecting such objects.

Various products, such as some of those manufactured in the electronics industries (e.g., certain wafers, integrated chips and hybrid circuits), require very precise operating characteristics and specifications over a wide range of temperatures. Accordingly, it is often desirable to inspect these products under very precise temperature conditions over a range of temperatures so that they can be processed, characterized, and/or tested to insure good quality control. Systems accordingly have been developed for processing, testing and/or inspecting such products under temperature controlled conditions. One family of systems for providing such an inspection for these types of products found in the electronics industries and which have proven reliable and valuable is the family of systems manufactured and sold by the assignee of the present invention, Temptronic Corporation of Newton, Mass. under the trademark Thermochuck. The Thermochuck systems generally include a controller, which includes essentially all of the system controls, and a temperature-controlled table or chuck connected to the controller and adapted to hold in place by a "negative pressure vacuum" (as used herein the term "negative pressure vacuum" is intended to mean an air pressure less than ambient pressure) the object under inspection. The table usually includes one or more heating and/or cooling elements for heating and/or cooling the object under inspection to a particular temperature of interest, and a temperature sensing device for sensing that temperature and generating an electrical signal which is a function of that temperature. When inspecting objects such as wafers, integrated circuits or hybrid circuits, with for example a microscope or a probing device, it may not only be desirable to hold the object with a negative pressure vacuum on the table through a very controlled range of temperatures, but also rotate the table during the inspection or testing sequence.

A prior art rotatable table for holding such products is disclosed in Offenlegungsschrift No. 27 53 684, published in the name of Reitinger. In this prior art device cables are utilized to connect the heating elements and temperature sensing devices from the table to testing equipment. This, however, limits the amount of rotation of the prior art table, since the cables rotate with the table. Since many objects under inspection require at least a full 360° rotation during examination at each temperature of interest, the operator must rotate the table in the opposite direction to rewind the cables after each such examination at each such temperature. This is, of course, time consuming and inefficient which is of particular importance when high speed inspection is desired, as is typical in characterizing and testing electronic components such as wafers, integrated chips and hybrid circuits. Thus, in the latter instance the prior art table disclosed in Offenlegungsschrift No. 27 53 684 is considered to be impractical.

Accordingly, it is an object of the present invention to provide an improved rotatable support table for supporting and holding objects in place, the improved table overcoming or substantially reducing the above-noted problems of the prior art.

Another object of the present invention is to provide an improved table or chuck for supporting and holding objects in place by a negative pressure vacuum, while inspecting such objects under temperature controlled conditions, the table being capable of unlimited rotational movement.

These and other objects are achieved by an improved device for supporting and holding an object in place. The device comprises a shaft mounted for rotation about a rotation axis, and a top plate coupled to and rotatable with the shaft. The top plate comprises a substantially planar top surface disposed normally to said axis, a bottom surface disposed opposite the top surface, and at least one aperture disposed in the top surface for providing a negative pressure vacuum so that the object can be held in place on the top surface by the negative pressure vacuum. Electrical temperature sensing means is disposed in the top plate for providing an electrical signal as a function of the temperature of the top plate. Electrical temperature modification means is coupled to and rotatable with the shaft and disposed relative to the bottom surface of the top plate for maintaining the temperature of the top plate at a preselected temperature. Heat sink means is coupled to and rotatable with the shaft and disposed relative to the temperature modification means for drawing excess heat from the temperature modification means away from the top plate. Finally, the table comprises a plurality of electrically-conductive brushes mounted in a spaced-apart relation, and a plurality of electrically-conductive rings concentrically mounted with respect to the axis. Each ring is mounted in a plane normal to the axis and is in electrical contact with and rotatably movable with respect to at least one of the brushes as the table turns about the axis, wherein at least two of the rings are electrically coupled to the electrical temperature sensing means so that the electrical signal can be transmitted from the table, and at least two of the rings are electrically coupled to the temperature modification means so that electrical power can be transmitted to the temperature modification means.

Other objects of the invention will in part be obvious and will in part appear hereinafter. The invention accordingly comprises the apparatus possessing the construction, combination of elements and arrangement of parts which are exemplified in the following detailed disclosure, and the scope of the application of which will be indicated in the appended claims.

For a fuller understanding of the nature and objects of the present invention reference should be had to the following detailed description taken in connection with the accompanying drawings wherein.

Figure 1:
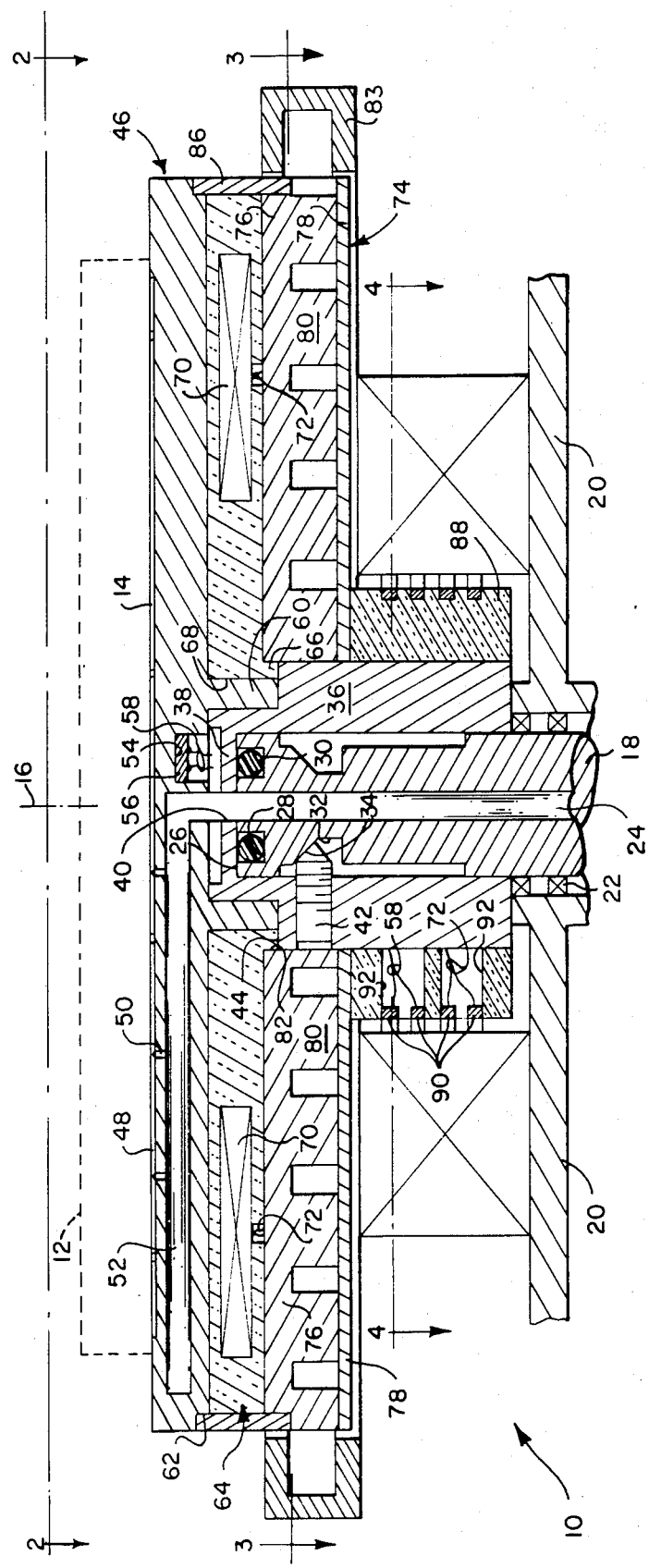
FIG. 1 is an axial cross-sectional view, partially cut away, of the preferred embodiment of the present invention.

Referring to the drawings, wherein the same numerals are used to designate similar or identical parts, the preferred embodiment of the table or chuck of the present invention is designated at 10. The table 10 is adapted to support objects, such as the object indicated by dotted lines at 12. The object 12 can be for example a wafer, integrated circuit or hybrid circuit. The object 12 is held in place on the top surface 14 of the table by a negative pressure vacuum and can be rotated about the axis 16 an unlimited amount in either rotational direction while subjected to a predetermined range of temperatures.

More particularly, table 10 comprises a shaft 18 suitably mounted for rotation about axis 16. Specifically, shaft 18 is suitably supported in bearings, schematically shown at 22, for rotation relative to the stationary base 20. Further, suitable gearing (not shown) may be provided for rotatably driving the shaft 18 about axis 16 by hand, or other means such as a stepping motor (also not shown). Shaft 18 includes an air conduit 24 for forming an air pathway, the latter extending coaxially with axis 16 through the top end 26 of the shaft. The conduit 24 is connected through a suitable fitting (not shown) to a source of air at a negative pressure such that the conduit is adapted to freely rotate in the fitting with the shaft. The top end 26 of the shaft includes an annular groove 28 coaxially aligned with the axis 16 for receiving the O-ring 30. The outer cylindrical surface of shaft 18 includes a notch 32 having a frusto-conical surface 34 inwardly inclined from the outer cylindrical surface of the shaft away from the top end 26 of the shaft.

A hollow cylindrical sleeve or collar 36 has an upper end 38 having an aperture 40 for receiving air conduit 24, and an internal diameter dimensioned with respect to the outer diameter of shaft 18 so that the sleeve fits around the shaft. The cylindrical wall of sleeve 36 is provided with an aperture for receiving set screw 42 which engages the frusto-conical surface 34 so as to force the end 26 of shaft 18 as well as O-ring 30 into engagement with the internal surface of the end 38 of the sleeve 36 thereby coupling the sleeve to the shaft so that the former is rotatable with the latter about the axis 16. The outer surface of sleeve 36 includes a radial outwardly directed shoulder 44.

Table 10 also includes a top plate 46 the top side of which forms top surface 14. The top surface is preferably formed with a pattern of radial and concentric grooves 48, and at least one but preferably a plurality of apertures 50 formed in the plate in at least one of the grooves so that the object 12 will be held by the negative pressure vacuum and yet it can be easily removed from the top surface. Apertures 50 communicate with an air passageway 52 disposed below the apertures in the plate. Passageway 52 is suitably coupled in an air tight manner to the conduit 24 so that air can be drawn from the top surface, through apertures 50, along passageway 52 and then through the pathway formed by conduit 24 so as to achieve the negative pressure vacuum on the top surface 14 and hold the object 12 in place. The bottom surface of the plate 46 is provided with an aperture 54 approximately in the center of the plate for receiving suitable electrical means, such as a thermistor 56, for sensing the temperature of the top plate. Wires 58 connected to opposite ends of the thermistor 56 extend down through aperture 54 so that current can be generated through the thermistor 56 and the voltage across the thermistor can be sensed. As is well known, this voltage is a function of the temperature sensed. A hollow cylindrical seating portion 60 has an outer diameter smaller than the outer diameter of sleeve 36 and an internal diameter and depth such that (1) the seating portion can snuggly receive the sleeve 36 and rest on the shoulder 44 of the sleeve, and (2) plate 46 will be coupled to and rotate with the shaft. The bottom surface of plate 46 is also provided with a peripheral groove forming a cylindrical shoulder 62.

The table 10 also includes means for modifying the temperature of top plate 46 so as to maintain the top plate at a predetermined temperature. Preferably the means is in the form of a second plate 64. Second plate 64 is made of a heat conductive material and has an outer diameter approximately equal to the internal diameter of the groove forming shoulder 62 of top plate 46. Second plate 64 also includes a hollow cylindrical extension 66 extending from the bottom surface of plate 64 and having an outer diameter the same as the outer diameter of sleeve 36 and a central aperture 68 extending through the plate and having an internal diameter such that the seating portion 60 of the top plate is snuggly received in the aperture and the extension 66 rests on the shoulder 44 of the sleeve 36. Second plate 64 also includes at least one, and preferably a plurality of electrically-responsive temperature elements 70 radially and circumferentially spaced within the plate so as to provide substantially uniform temperature control of the top plate. Where the table 10 is used strictly for heating the top plate to temperatures at or above ambient temperature, elements 70 are each heating elements. Where, however, the table is used for cooling the top plate to temperatures below ambient temperatures (or the table is used for both heating and cooling the top plate to temperatures above and below ambient temperature) the elements can be thermoelectric elements of a type well known in the art. The plate 64 is constructed so as to provide suitable spacing for wires 72 for carrying electrical power to the elements 70.

A heat sink in the form of plate 74 is provided below the second plate for drawing excess heat from the second plate 64 away from the top plate 46. Plate 74 includes an aperture 82 for receiving the sleeve 36, a top disk 76 having an external diameter the same as the second plate 64, bottom disk 78 and a baffle 80 disposed between and securely connected to the top and bottom disks and having a honeycomb structure so as to provide air pockets between the two disks. An arcuate-shaped air exhaust manifold 83 is disposed adjacent a portion of the outer radial edge of the plate 74 for blowing air against the plate 74 to help dissapate heat. The manifold includes a fitting 84 for attaching the manifold to a source of air at a positive pressure (i.e., air at a pressure greater than ambient pressure).

A clamping ring 86 is provided around the outer radial edges of the shoulder 62 of plate 46, second plate 64 and the top disk of plate 74 so as to clamp the three plates together to insure that they rotate with shaft 18 about axis 16.

Finally, in order to insure that when the table is in use, the plates and shaft can be rotated about the axis 16 in either rotational direction by an unlimited amount, a hollow-cylindrical sleeve 88 is provided. Sleeve 88 is made of an electrically insulative material and includes an internal diameter such that the sleeve is snuggly received by the sleeve 36 so as to be rotatable therewith. The outer cylindrical surface of sleeve 88 is provided with grooves for receiving the electrically-conductive rings 90, preferably disposed in parallel spaced apart planes normal to the axis 16. Suitable apertures such as those radial-directed apertures shown at 92, carry the wires 58 and 72 so that thermistor 56 can be connected to two of the rings and elements 70 can be connected preferably to two other rings.

At least one but preferably several electrically-conductive brushes 94 are stationarily mounted in blocks 96 relative to the base 20 so that as rings 90 rotate about axis 16, brushes 94 maintain contact with the corresponding rings so as to transmit the power to elements 70 and transmit the necessary current to and sense the voltage drop across thermistor 56 in top plate 46. Preferably, four brushes are used with each ring. The brushes are each mounted on electrically-conductive flexible arms 98 so as to be biased against the particular ring to which they contact. The brushes for each ring are arranged symmetrically in the plane of that ring so as to provide substantially opposing pressure against the ring to minimize any transient effects resulting from vibrations in the table.

Figure 5:
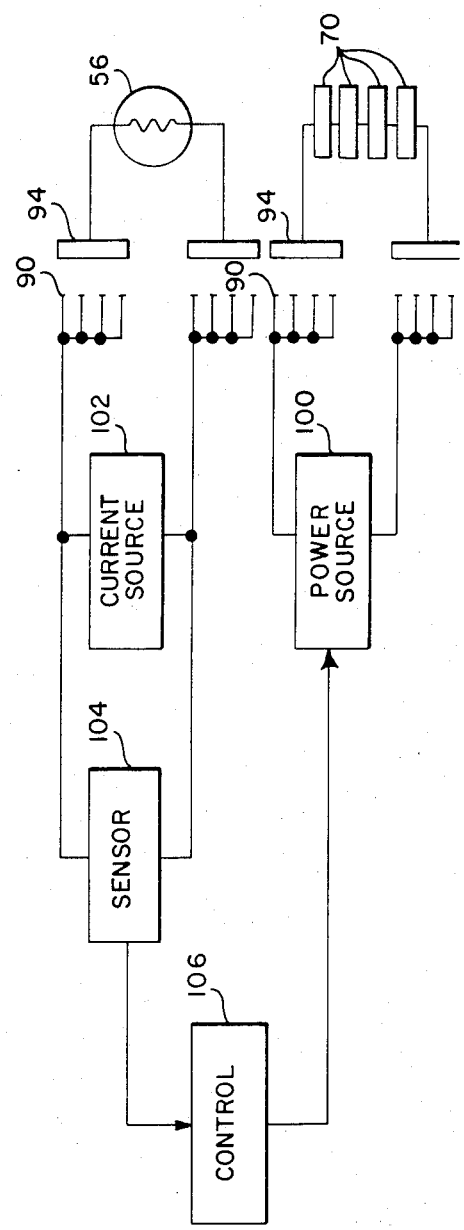
FIG. 5 is a partial schematic, partial block diagram of the electrical system of the present invention.
Figure 2:
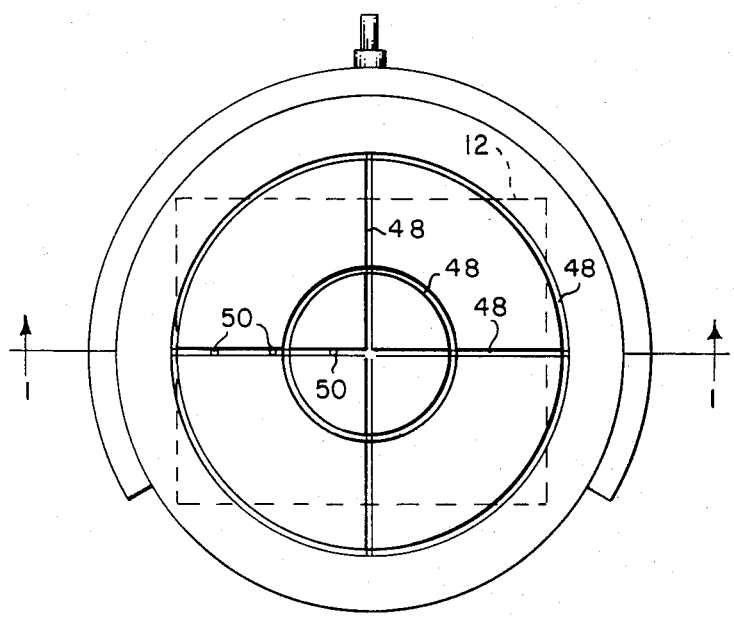
FIG. 2 is a plan view, taken along line 2—2 in FIG. 1.
Figure 3:
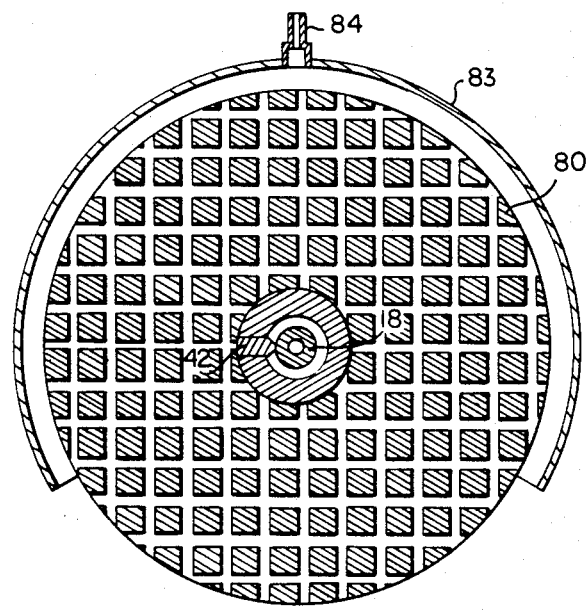
FIG. 3 is a radial cross-sectional view taken along line 3—3 in FIG. 1.
Figure 4:
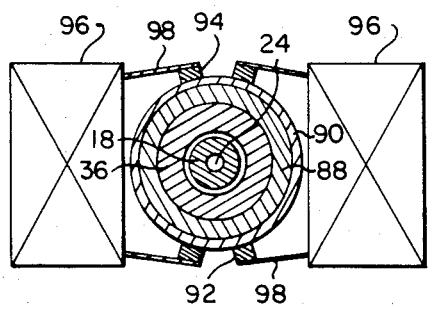
FIG. 4 is a radial cross-sectional view taken along line 4—4 in FIG. 1.

As shown in the electrical diagram of FIG. 5, elements 70 are connected in series to two rings, and the corresponding brushes 94 contacting these two rings are respectively connected to opposite terminals of a DC power source 100 for energizing the elements. Thermistor 56 is connected to the other two rings. The corresponding brushes contacting these two rings are connected to a source 102 of DC current for creating a voltage drop across the thermistor and suitable means 104 for sensing the voltage drop across the thermistor. As is well known the voltage sensed across the thermistor is a function of the temperature sensed. In a manner well known in the art a servo-control system 106 can be provided for using the voltage sensed across thermistor 56 to control the DC power provided to the elements 70 so as to maintain a predetermined set temperature.

It will be appreciated that while the preferred embodiment has been described various modifications can be made to the invention without departing from the scope of the invention. For example, while the rings 90 are arranged in spaced-apart parallel planes, the rings could be concentrically arranged in a spaced apart relationship within the same plane around the axis 16 on, for example, an electrically-insulative disk positioned below the plate 74. In this case one or more brushes would be positioned in radially spaced positions from axis 16 so as to contact the respective rings as they rotated about axis 16. Further, while the rings have been described as rotatable with the shaft 18 and the brushes stationary with respect to the base 20, it is possible to mount the brushes so that they rotate with the shaft, while the rings remain stationary with respect to the base.

The invention has several advantages. The table 10 shown is a simple compact table for holding an object 12 in place on the top surface 14 with a negative pressure vacuum at various temperatures while being able to rotate the table about the axis 16. The use of the brush and ring assembly allows both power to be delivered to elements 70 and temperature information signals to be sensed from thermistor 56. Further, the brush and ring assembly allows the table to be rotated about axis 16 in either direction an unlimited amount.

Since certain changes may be made in the above apparatus without departing from the scope of the invention herein involved, it is intended that all matter contained in the above description or shown in the accompanying drawings shall be interpreted in an illustrative and not a limiting sense.

What is claimed is:

1. A device for supporting and holding an object in place, said device comprising, in combination:
   a shaft mounted for rotation about a rotation axis;
   a top plate coupled to and rotatable with said shaft and comprising a top substantially planar surface disposed normally to said axis, a bottom surface disposed opposite said top surface, and at least one aperture disposed in said top surface for providing a negative pressure vacuum so that said object can be held in place by said negative pressure vacuum on said top surface;
   electrical temperature sensing means disposed in and rotatable with said top plate for providing an electrical signal as a function of the temperature of said top plate;
   electrical temperature modification means responsive to said electrical signal, coupled to and rotatable with said shaft and disposed relative to said bottom surface of said top plate for maintaining the temperature of said top plate substantially at a preselected temperature;
   heat sink means coupled to and rotatable with said shaft and disposed relative to said temperature modification means for drawing excess heat from said temperature modification means away from said top plate; and
   a plurality of electrically-conductive brushes mounted in a spaced-apart relation, and a plurality of electrically-conductive rings coaxially mounted with respect to said axis, each said ring being mounted in a plane normal to said axis and in electrical contact with and rotatably movable with respect to at least one of said brushes when said shaft, top plate, electrical temperature sensing means, electrical temperature modification means and said heat sink means rotate about said axis, wherein at least two of said rings are electrically coupled to said electrical temperature sensing means so that said electrical signal can be transmitted through the corresponding ones of said brushes, and at least two of said rings are electrically coupled to said temperature modification means so that electrical power can be transmitted to said temperature modification means.

2. A device according to claim 1, wherein said top plate includes an air passageway extending through said top plate and connected to said aperture for providing the negative pressure vacuum to said aperture.

3. A device according to claim 2, wherein said top plate includes a plurality of apertures in said top surface, each said aperture being connected to said passageway and providing said negative pressure vacuum to said top surface.

4. A device according to claim 3, wherein said passageway is outwardly radially directed from said axis through said plate.

5. A device according to claim 4, further including means for defining an air pathway extending through said shaft and connected to said air passageway of said top plate for providing said negative pressure to said air passageway.

6. A device according to claim 5, wherein said pathway is aligned with said axis.

7. A device according to claim 4, further including a plurality of grooves formed in said top surface and disposed in a predetermined pattern, said apertures being in communication with at least one of said grooves.

8. A device according to claim 7, wherein said predetermined pattern includes grooves extending in an outward radial direction from said axis and grooves formed as rings concentric with one another as well as said axis.

9. A device according to claim 1, wherein said temperature modification means includes a second plate disposed adjacent said bottom surface of said top plate and at least one electrically-responsive temperature element disposed in said second plate for maintaining said top plate at said predetermined temperature.

10. A device according to claim 1, wherein said heat sink means includes a heat conductive plate disposed adjacent said temperature modification means and manifold means for blowing air against said heat conductive plate.

11. A device according to claim 10, wherein said heat conductive plate includes a disk having a honeycomb construction for dissipating heat.

12. A device according to claim 11, wherein said manifold is arcuate shaped and positioned adjacent the outer radial edge of said heat conductive plate.

13. A device according to claim 1, further including a cylindrical collar secured to said shaft, said cylindrical collar includes an outwardly directed radial seat on the outer cylindrical surface of said collar and said top plate is supported at least in part by said seat.

14. A device according to claim 1, wherein said rings are securely coupled to and rotatable with said shaft.

15. A device according to claim 14, wherein said rings are disposed in mutually parallel, spaced-apart planes.

16. A device according to claim 15, further including an electrically-insulative cylindrical sleeve coaxially mounted with and coupled to rotate with said shaft for supporting each of said rings.

17. A device for supporting and holding an object in place, said device comprising, in combination:
a shaft mounted for rotation about a rotation axis, said shaft including an air pathway disposed coaxially with said axis;
a cylindrical collar secured to said shaft and including a radially directed seat disposed on its outer cylindrical surface;
a top plate supported at least in part on said seat of said collar so as to be coupled to and rotatable with said shaft, said top plate including a top substantially planar surface disposed normally to said axis, a bottom surface disposed opposite said top surface, at least one aperture disposed in said top surface for providing a negative pressure vacuum to said top surface so that said object can be held in place by said negative pressure vacuum on said top surface, a passageway connecting said aperture and said pathway of said shaft for providing said negative pressure vacuum from said pathway to said aperture, and a plurality of grooves formed in said top surface and disposed in a predetermined pattern, said aperture being in communication with at least one of said grooves;
electrical temperature sensing means disposed in said top plate for sensing the temperature of said top plate and providing an electrical signal as a function of the sensed temperature of said top plate;
electrical temperature modification means including a second plate disposed adjacent said bottom surface of said top plate and a plurality of electrically-responsive elements disposed in said second plate for maintaining the temperature of said top plate at a predetermined temperature;
heat sink means including a heat conductive plate disposed adjacent said second plate for drawing excess heat from said second plate away from said top plate, and manifold means for blowing air against said heatconductive plate; and
a plurality of electrically-conductive brushes mounted in a spaced-apart relation, and a plurality of electrically-conductive rings concentrically mounted with respect to said axis, each said ring being mounted in a plane normal to said axis and in electrical contact with and rotatably movable with respect to at least one of said brushes, wherein at least two of said rings are electrically coupled to said electrical sensing means so that said electrical signal can be transmitted through the corresponding brushes, and at least two of said rings are electrically coupled to said electrically-responsive elements so that electrical power can be transmitted to said elements.

* * * * *